United States Patent [19]

Gibson

[11] Patent Number: 5,031,977
[45] Date of Patent: Jul. 16, 1991

[54] DEEP ULTRAVIOLET (UV) LENS FOR USE IN A PHOTOLIGHOGRAPHY SYSTEM

[75] Inventor: John A. Gibson, Sunnyvale, Calif.

[73] Assignee: General Signal Corporation, Stamford, Conn.

[21] Appl. No.: 456,677

[22] Filed: Dec. 27, 1989

[51] Int. Cl.$^5$ .................................................. G02B 3/00
[52] U.S. Cl. ...................................... 350/1.4; 350/1.2; 350/438; 350/442
[58] Field of Search .................. 350/1.2, 1.4, 438, 442, 350/445, 446, 482, 483

[56] References Cited

U.S. PATENT DOCUMENTS

| | | | |
|---|---|---|---|
| 4,103,989 | 8/1978 | Rosin | 350/442 |
| 4,171,871 | 10/1979 | Dill et al. | 350/444 |
| 4,391,494 | 7/1983 | Hershel | 350/442 |

Primary Examiner—Bruce Y. Arnold
Assistant Examiner—J. P. Ryan
Attorney, Agent, or Firm—Heller, Ehrman, White & McAuliffe

[57] ABSTRACT

A deep ultraviolet (UV) lens for use in a photolithography system provides enhanced resolution by using shorter wavelengths of light exposure (in the ultraviolet wavelength). The improved lens includes a meniscus and a first mirror for imaging light in the deep ultraviolet range to the meniscus. The meniscus images the light to a plano-convex lens which is located proximately to the concave surface of the meniscus. The lens further includes a pair of optical elements (prisms) proximately located to the plano surface of the plano-convex lens. The present invention provides for operation in the deep ultraviolet range with a aperture in one embodiment of 0.350.

4 Claims, 4 Drawing Sheets

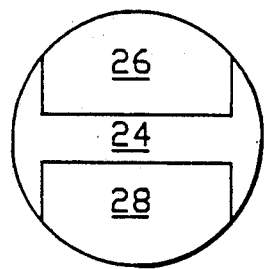
FIG.—2A
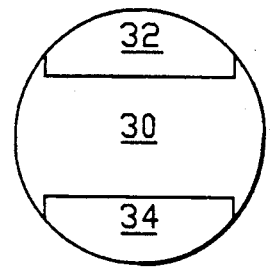
FIG.—2B
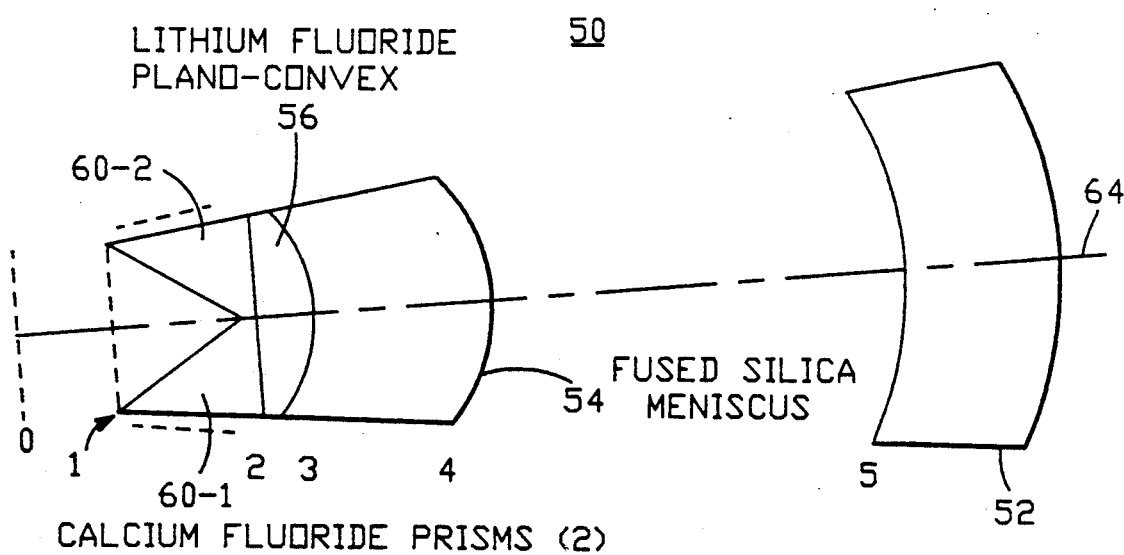
FIG.—3

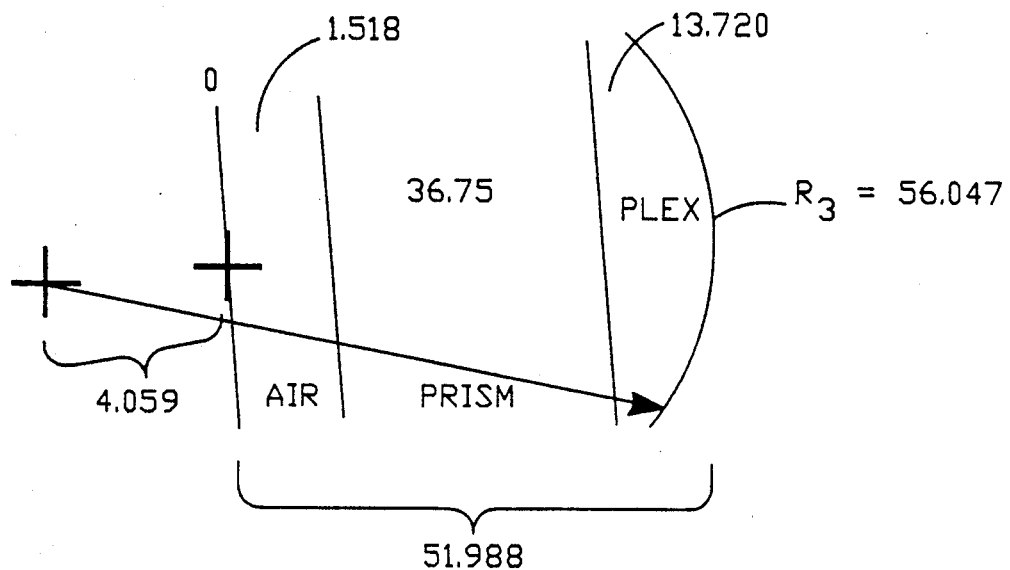
FIG.—4
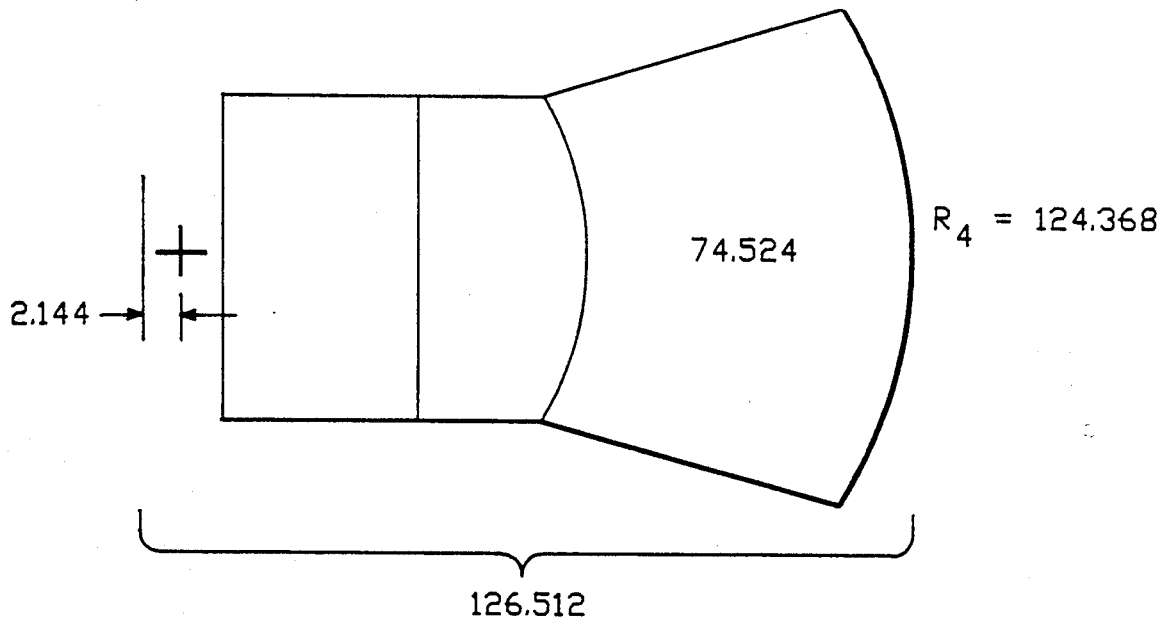
FIG.—5

DEEP ULTRAVIOLET (UV) LENS FOR USE IN A PHOTOLIGHOGRAPHY SYSTEM

BACKGROUND OF THE INVENTION

The present invention relates to a deep ultraviolet (UV) lens for use in a photolithography system. In particular, the present invention is intended to be utilized in a photolithography system for forming patterns on semiconductor wafers.

The present invention is an improvement on the optical system described in U.S. Pat. No. 4,391,494, issued July 5, 1983 to Ronald S. Hershel and assigned to General Signal Corporation, the details of which are hereby incorporated by reference. The system described in the aforementioned patent is a unit magnification achromatic anastigmatic optical projection system that uses both reflective and refractive elements in a complementary fashion to achieve large field sizes and high numerical apertures. The system is basically symmetrical, thus eliminating all aberrations of odd order such as coma, distortion and lateral color. All of the spherical surfaces are nearly concentric, with the centers of curvature located close to the focal plane. Thus, the resultant system is essentially independent of the index of refraction of the air in the lens, making pressure compensation unnecessary.

However, in order to attain sufficient working space for movement of the reticle and wafer, the object and image planes of this system are separated through the use of two symmetrical folding prisms. The cost of this gain in working space is the reduction of available field size to about 25% to 35% of the total potential field. In the past, this reduction in field size has not been critical, since it has been possible to obtain both acceptable field size and the degree of resolution required for state-of-the-art circuits. However, with increasing demands for higher resolution capabilities from such systems, applicant has recognized a need to modify the system so that even higher numerical apertures and higher resolution may be obtained while maintaining acceptable field size.

While the subject matter described in the '494 patent is quite suitable for normal photolithography aspects, such approaches have not provided sufficient capability in deep ultraviolet (UV) photolithography applications.

SUMMARY OF THE INVENTION

It is an object of the present invention to provide an improved deep ultraviolet (UV) lens for use in a photolithography system.

Briefly, the improved lens according to the present invention includes a meniscus (desirably of fused silica) and a first mirror for imaging light exposure in the deep ultraviolet range to the meniscus.

The improved lens further includes a plano-convex lens, (desirably of lithium fluoride), which is located proximate to the concave surface of the meniscus and a pair of optical elements (prisms) desirably made of calcium fluoride, which are located proximate to the plano surface of the plano-convex lens.

Other objects, features and advantages of the present invention will become apparent from the following detailed description when taken in conjunction with the accompanying drawings.

BRIEF DESCRIPTION OF THE DRAWINGS

The accompanying drawings which are incorporated in and form a part of this specification illustrate an embodiment of the invention and, together with the description, serve to explain the principles of the invention.

FIGS. 2A and 2B are schematic diagrams showing the fields available with the system described in FIG. 1.

FIG. 3 depicts an optical schematic view of an improved deep ultraviolet lens (UV) for use in a photolithography system according to the present invention.

FIGS. 4–7 show graphic depictions of the center curvature of the plano-convex lens, the meniscus and the mirror of FIG. 3, respectively.

DETAILED DESCRIPTION OF THE PREFERRED EMBODIMENT

Reference will now be made in detail to the preferred embodiment of the invention, an example of which is illustrated in the accompanying drawings. While the invention will be described in conjunction with the preferred embodiment, it will be understood that it is not intended to limit the invention to that embodiment. On the contrary, it is intended to cover alternatives, modifications and equivalents as may be included within the spirit and scope of the invention as defined by the appended claims.

Figure 1:
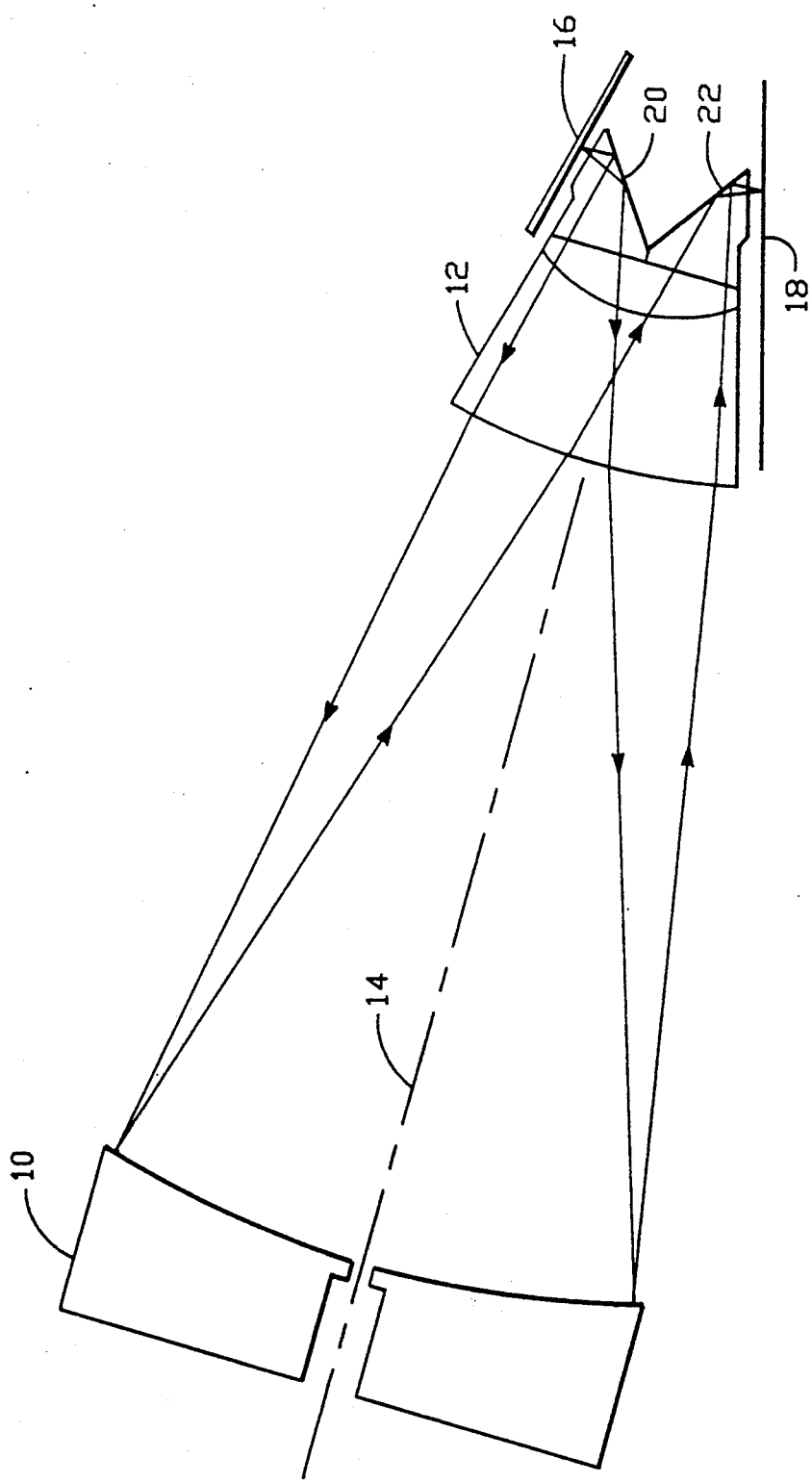
FIG. 1 depicts an optical and schematic view of a known optical projection system of the type described in U.S. Pat. No. 4,391,494.

FIG. 1 illustrates an optical projection system of the type described in U.S. Pat. No. 4,391,494 including a mirror 10 and a composite achromat-prism assembly 12 which are disposed symmetrically about an optical axis 4. The reticle pattern plane 16 lies on one side of the axis 14, and the wafer image or object plane 18 lies on the opposite side. Prisms 20 and 22 couple light into and out of the optical system and separate the reticle plane 16 from the horizontal wafer plane 18. An air gap between reticle plane 16 and prism 20 and wafer plane 18 and prism 22 provides sufficient mechanical clearance and space for movement of a wafer and reticle into and out of the respective wafer image plane 18 and reticle pattern plane 16. This system has proved quite advantageous and useful with systems of moderate to low numerical aperture. However, because of the use of the prisms 20 and 22, the system inherently includes a certain amount of field which is lost due to vignetting that is dependent on numerical aperture.

Thus, FIG. 2A diagramatically illustrates that in an optical system having a relatively low numerical aperture, a relatively small portion 24 in the center of a lens field is lost due to vignetting but still leaves a relatively large reticle field 26 and wafer field 28. However, as is illustrated in FIG. 2B at relatively high numerical apertures the vignetted portion 30 increases markedly and the reticle field 32 and wafer field 34 decrease correspondingly.

Referring now to FIG. 3, an optical schematic view of the improved deep ultraviolet lens 50 according to the present invention is depicted. The improved lens of FIG. 3 is an improvement over that described in the '494 patent identified above. The '494 patent provides suitable optical aspects in the G and H wavelengths (405 and 436 nanometers). The present invention provides improved and enhanced resolution due to shorter wavelengths in the deep ultraviolet range.

The present invention provides a combination of components as seen in FIG. 3, which transmits a light source in the deep ultraviolet range at the proper wavelength and color and aberration correction.

In FIG. 3, the lens 50 includes a first mirror 52 and a meniscus 54 which is desirably of fused silica. The lens 50 of FIG. 3 also includes a plano-convex lens 56, desirably of lithium fluoride, and a pair of optical elements 60-1, 60-2 (desirably prisms) which are of calcium fluoride. In FIG. 3, the lens 50 includes an optical axis 64. Operation of lens 50 to a source of light exposure (desirably in the the ultraviolet range) is analogous to that as described in the '494 patent identified above.

The particular component elements of FIG. 3 including numerical aperture (NA), field height, design wavelengths, thickness radius and indexes are shown in Table A below.

TABLE A

| Numerical Aperture .350 | | Field Height 24.3 | | Design Wavelengths | | |
|---|---|---|---|---|---|---|
| | | | | 249.8 nm | 243.8 nm | |
| Surface | Thickness | Radius | Index 1 | Index 2 | Glass | |
| 1 | 1.518 | 0.000 | 1.000000 | 1.000000 | AIR | |
| 2 | 36.750 | 0.000 | 1.467369 | 1.469651 | CaF2 | |
| 3 | 13.720 | 56.047 | 1.418866 | 1.420624 | LiF2 | |
| 4 | 74.524 | 124.368 | 1.507555 | 1.510984 | SiO2 | |
| 5 | 380.874 | 508.000 | 1.000000 | 1.000000 | REFL | |

As can be seen in Table A above, the present invention of FIG. 3 has a numerical aperture (NA) of 0.350 and design wavelengths of 249.8 nanometers and 243.8 nanometers.

In Table A above, the surface designation column corresponds to the respective elements set forth in FIG. 3 wherein, for example, thickness 4 is the distance from the plano-convex lens 56 of surface 3 to surface 4 of the meniscus 54 in FIG. 3, which is 74.524 millimeters. The radius of curvature at that surface is 124.368.

These values should be compared with that of the '494 patent with numerical aperture of 0.315. As can be seen, the present invention provides an improved numerical aperture using shorter wavelength to provide enhanced resolution.

Referring now to FIGS. 4-7, the center curvatures of the components of the lens 50 of FIG. 3 have been calculated from Table A.

In FIG. 4, there is shown the object image plane (O), an air gap, the prism 60 thickness and the plano-convex lens 56 thickness (going from left to right) with a total distance of 51.988 milllimeters.

The center curvature of the plano-convex radius R3 in FIG. 4 is calculated from the data in Table A to be left of the object image plane by 4.059 millimeters.

Similarly, the center curvature of the meniscus lens 54 of FIG. 3 is shown in FIG. 5. The radius of curvature of the meniscus lens 54 in FIG. 5 lies to the right of the object image plane by 2.144 millimeters.

Figure 6:
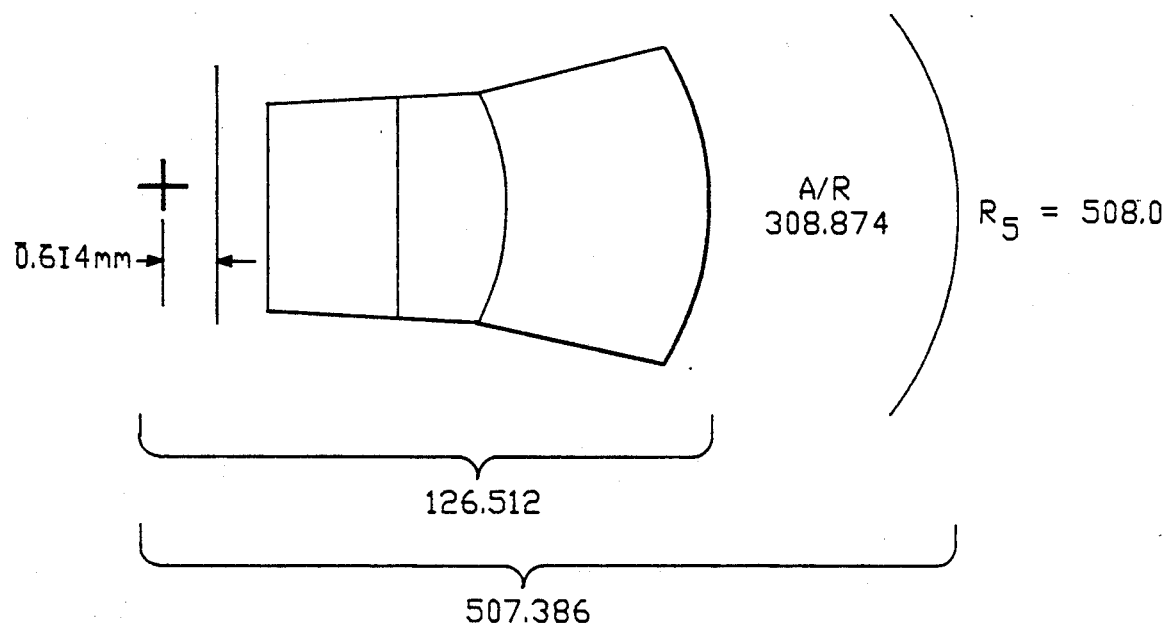

FIG. 6 illustrates the calculation where the radius of curvature of mirror 52 of FIG. 3 lies to the left of the object image plane by 0.614 millimeters, which is not as far to the left as the plano-convex lens 56 of FIG. 4.

Figure 7:
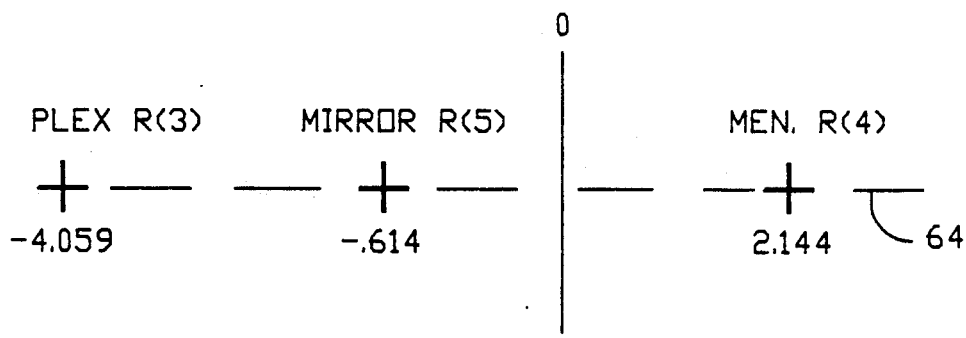

FIG. 7 shows the same three points of FIGS. 4, 5 and 6, in which the plano-convex center curvature is the farthest to the left of the object image plane. The mirror image curvature is slightly to the left of the object image plane (O) and the meniscus center curvature is to the right of the object image plane. All of the center curvatures are along the optical axis 64 of FIG. 3.

FIG. 7 shows with the particular ordering of the centers of curvatures of the plano-convex lens 56, the mirror 52 and the meniscus 54 which allows the improved lens to be a viable producable lens with very high performance and which meets required specifications for deep ultraviolet wavelength aspects.

The foregoing description of the preferred embodiment of the invention has been presented for purposes of illustration and description. It is not intended to be exhaustive or to limit the invention to the precise form disclosed, and many modifications and variations are possible in light of the above teaching. The preferred embodiment was chosen and described in order to best explain the principles of the invention and its practical applications to thereby enable others skilled in the art to best utilize the invention and various embodiments and with various modifications as are suited to the particular use contemplated. It is intended that the scope of the invention be defined only by the claims appended hereto.

What is claimed is:

1. A deep ultraviolet lens comprising:
    a meniscus made of fused silica,
    a first mirror for imaging light in the deep ultraviolet range to said meniscus,
    a plano-convex lens made of lithium fluoride,
    a pair of optical prisms made of calcium fluoride proximately located to the plano surface of said plano-convex lens wherein said lens has a numerical aperture of approximately 0.350 and wherein the center curvature of the convex surface of said plano-convex lens is on one side of the center of curvature of the primary mirror and wherein the center of curvature of the convex meniscus surface is on the other side of the primary center of curvature and between the primary mirror and its center of curvature.

2. A deep ultraviolet lens comprising:
    a meniscus made of fused silica,
    a first mirror for imaging light in the deep ultraviolet range to said meniscus,
    a plano-convex lens made of lithium fluoride,
    a pair of optical prisms made of calcium fluoride proximately located to the plano surface of said plano-convex lens wherein said lens has a numerical aperture of approximately 0.350 and wherein the center of curvature of the convex surface of said plano-convex lens is on one side of the object image plane of said deep ultraviolet lens and wherein the center curvature of the convex surface said meniscus is on the other side of said object image plane, and wherein the center of curvature of said first mirror is on the same side and closer to said object image plane than the convex center of curvature of the plano-convex lens.

3. A unit magnification, achromatic, anastigmatic optical projection system of the catadioptric type particularly suited for use in microlithography at wavelengths below 320 nanometers, said projection system comprising:
    a primary mirror,
    a concave, spherical reflecting surface having an optical axis and a first center of curvature;
    an achromatic lens positioned between said reflecting surface and said first center of curvature, said achromatic lens comprising a fused silica meniscus lens closest to said primary mirror, an intermediate plano convex lens of lithium fluoride, and folding prisms located furthest from said primary mirror, said meniscus lens having a first convex surface facing said reflecting surface, said first convex surface having a second center of curvature between said first center of curvature and said meniscus lens, said meniscus lens also having a concave surface on the side facing away from said reflecting surface, said concave surface having a third center of curvature on the opposite side of said first center of curvature as said convex meniscus lens surface;

said achromatic lens also comprising a plano-convex lens made from lithium fluoride crystal, said plano-convex lens having a second convex surface facing said meniscus concave surface, said second convex surface having a fourth center of curvature on the opposite side of first center of curvature from said meniscus convex lens surface, said plano-convex lens also having a first flat surface being positioned closer to said second convex surface than either of said third and fourth centers of curvature; and said achromatic lens further comprising first and second prisms for coupling light to and from separate fields on said first flat surface, said prisms being made from calcium fluoride crystal.

4. The system as in claim 3 further comprising an optical path length such that the unfolded image and object planes of the projection system are on the opposite side of said second center of curvature from said first flat surface, each of said prisms also comprising a second flat surface facing one of said image and object planes, said second flat surfaces being positioned closer to said first center of curvature than either of said third and fourth centers of curvature.

* * * * *